(12) United States Patent
Shih et al.

(10) Patent No.: US 7,678,627 B2
(45) Date of Patent: Mar. 16, 2010

(54) PROCESS FOR PRODUCING THIN FILM TRANSISTOR HAVING LDD REGION

(75) Inventors: An Shih, Changhua (TW); Chao-Yu Meng, Taichung (TW); Wen Yuan Guo, Chiayi (TW)

(73) Assignee: TPO Display Corp., Chu-Nan (TW)

( * ) Notice: Subject to any disclaimer, the term of this patent is extended or adjusted under 35 U.S.C. 154(b) by 320 days.

(21) Appl. No.: 11/435,333

(22) Filed: May 16, 2006

(65) Prior Publication Data

US 2006/0214167 A1 Sep. 28, 2006

Related U.S. Application Data

(62) Division of application No. 10/782,533, filed on Feb. 19, 2004, now Pat. No. 7,098,492.

(30) Foreign Application Priority Data

Feb. 19, 2003 (TW) .............................. 92103462 A

(51) Int. Cl.
*H01L 21/00* (2006.01)
*H01L 21/84* (2006.01)
(52) U.S. Cl. ............... 438/163; 438/164; 257/E21.036; 257/E21.058
(58) Field of Classification Search .................. 435/45, 435/232; 438/163, 164; 257/E21.036, E21.058
See application file for complete search history.

(56) References Cited

U.S. PATENT DOCUMENTS

| | | | |
|---|---|---|---|
| 5,789,283 A | 8/1998 | Park | |
| 6,071,762 A | 6/2000 | Wu et al. | |
| 6,165,876 A | 12/2000 | Yamazaki et al. | |
| 6,211,533 B1 | 4/2001 | Byun et al. | |
| 6,281,552 B1 | 8/2001 | Kawasaki et al. | |
| 6,284,577 B1 | 9/2001 | Suzawa et al. | |
| 6,909,117 B2 | 6/2005 | Ohnuma | |
| 6,972,221 B2* | 12/2005 | Takahashi | 438/166 |
| 6,977,393 B2* | 12/2005 | Yamazaki et al. | 257/59 |
| 6,995,048 B2* | 2/2006 | Yoneda et al. | 438/149 |
| 2001/0004121 A1* | 6/2001 | Sakama et al. | 257/347 |
| 2005/0230755 A1* | 10/2005 | Yamazaki et al. | 257/350 |

FOREIGN PATENT DOCUMENTS

JP 2000299469 10/2000

(Continued)

*Primary Examiner*—Jarrett J Stark

(57) ABSTRACT

In a process for producing a TFT display, a polysilicon layer is patterned to define a first and a second TFT regions. A first doping material is implanted into a first exposed portion in the first TFT region to define a first doped region and a first channel region, and implanted into a second exposed portion in the second TFT region to define a second doped region and a second channel region. A second doping material is implanted into a third exposed portion smaller than the first exposed portion to form first source/drain regions and simultaneously define a first LDD region in the first TFT region. A first and a second gate structures are formed over the first and the second channel regions, respectively. In a certain direction, the first gate structure is longer than the first channel, and the second gate structure isn't longer than the second channel region.

9 Claims, 15 Drawing Sheets

FOREIGN PATENT DOCUMENTS

| | | |
|---|---|---|
| JP | 2001177101 | 6/2001 |
| JP | 2001-326364 | 11/2001 |
| JP | 2001-352073 | 12/2001 |
| JP | 2002134751 | 5/2002 |
| WO | WO 02/095834 A1 * | 11/2002 |

* cited by examiner

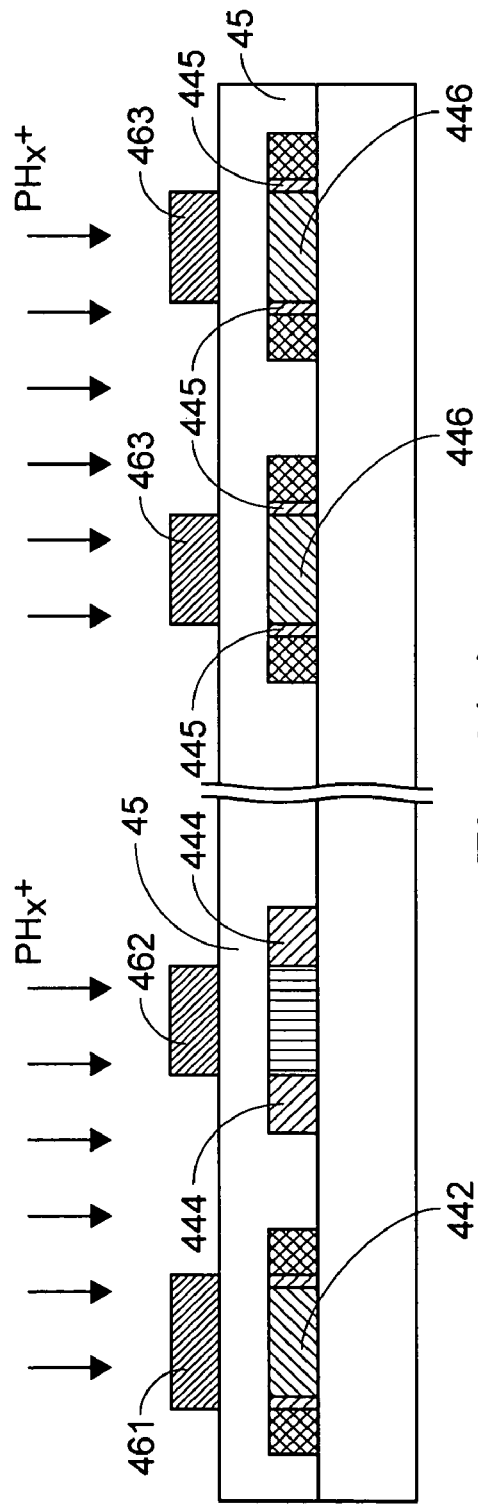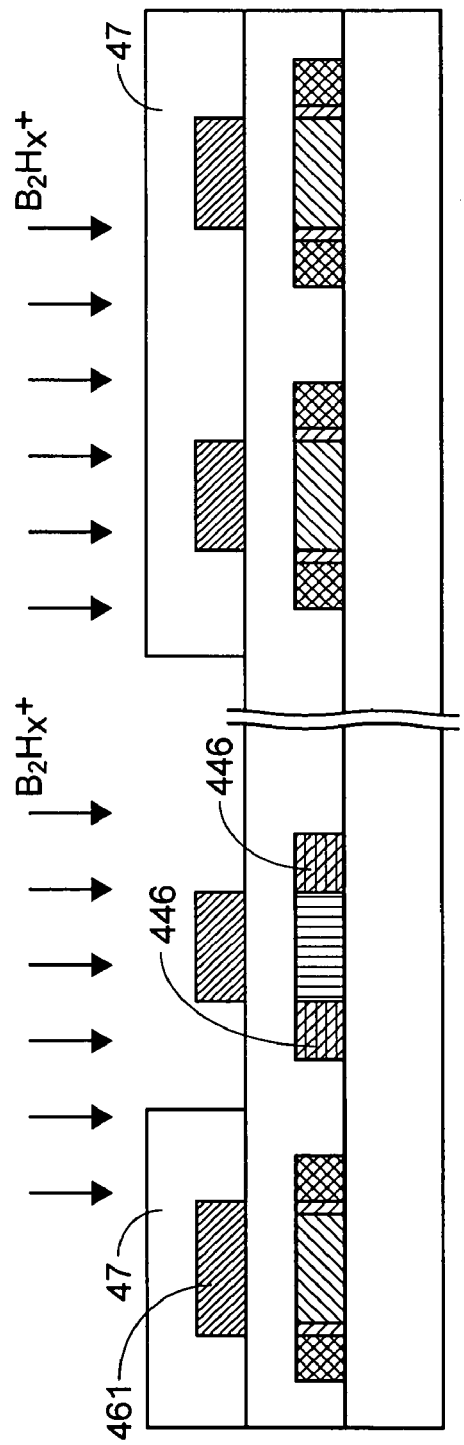

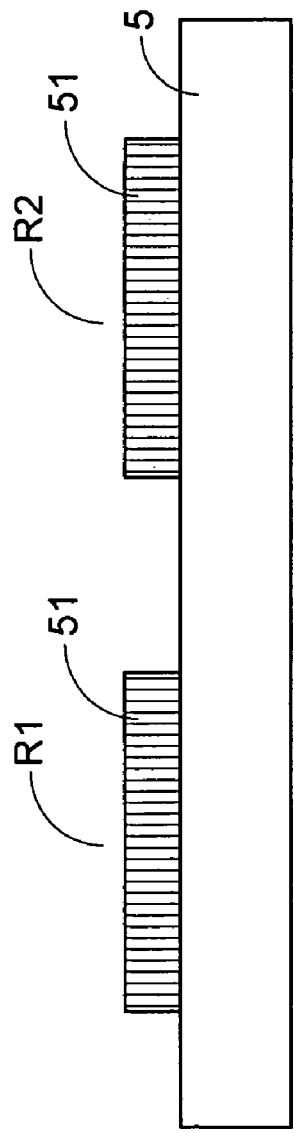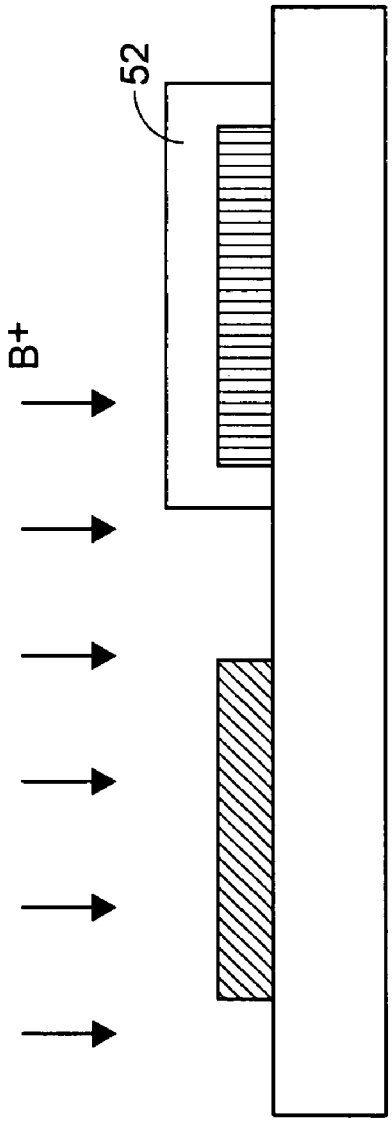

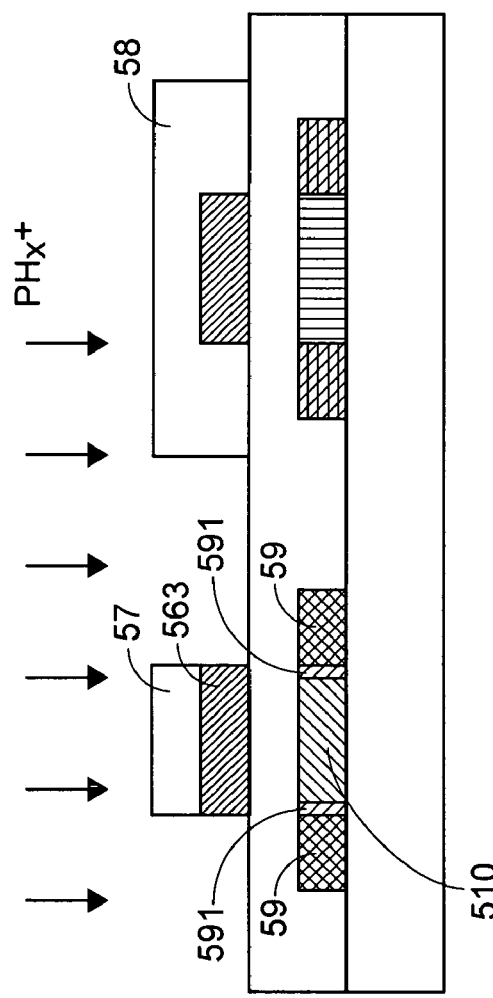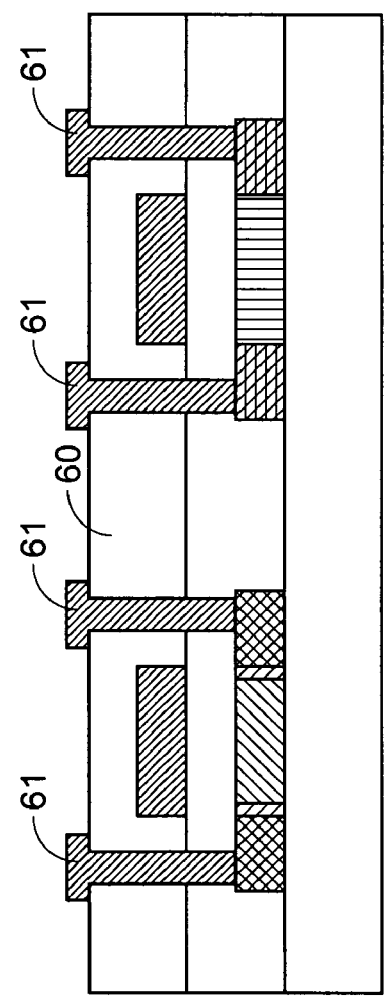

PROCESS FOR PRODUCING THIN FILM TRANSISTOR HAVING LDD REGION

CROSS REFERENCE TO RELATED APPLICATIONS

This application is a divisional of U.S. patent application Ser. No. 10/782,533, filed Feb. 19, 2004, now U.S. Pat. No. 7,098,492 which is incorporated by reference as if fully set forth.

FIELD OF THE INVENTION

The present invention relates to a process for producing a thin film transistor, and more particularly to a process for producing a low-temperature polysilicon thin film transistor having a lightly doped drain (LDD) structure.

BACKGROUND OF THE INVENTION

TFTs (Thin Film Transistors) are widely used as basic electronic devices for controlling pixels of a TFT liquid crystal display (TFTLCD). FIG. 1(a) is a block diagram schematically illustrating a conventional TFTLCD. Such TFTLCD comprises an active matrix 10 and driving circuits 11. The active matrix 10 is formed on a glass substrate 1, whereas the driving circuits 11 are electrically connected to the active matrix 10 via external lines 12. Nowadays, a so-called low-temperature polysilicon thin film transistor (LTPS-TFT) technology was developed due to improved electrical properties of TFT transistors and other benefits. Please refer to FIG. 1(b). The active matrix 10 and the driving circuits 11 can be directly formed on the glass substrate 1 so as to reduce fabricating cost.

A process for producing such LTPS-TFT is illustrated with reference to FIGS. 2(a) to 2(f).

In FIG. 2(a), a polysilicon layer 21 is formed on a glass substrate 2 by laser annealing an amorphous silicon layer applied to the glass substrate 2 at a low temperature, and patterning and etching the annealed silicon layer. Then, as shown in FIG. 2(b), a photoresist 22 is formed on a selected region of the polysilicon layer 21, and an ion-implantation procedure is performed on the resulting polysilicon layer 21 with the photoresist 22 serving as a mask. By the ion-implantation procedure, $B^+$ ions are implanted to form N-channel TFT zones. Then, a photoresist 23 is partially formed on the N-channel TFT zones, and $PHx^+$ ions are implanted into the N-channel TFT zones with the photoresist 23 serving as a mask, thereby forming source/drain regions 24, as can be seen in FIG. 2(c). After the photoresists 22 and 23 are removed, a gate insulator 25 is formed on the resulting structure. Then, gate metal 26 (for example made of molybdenum) is formed on the gate insulator 25, as shown in FIG. 2(d). The gate metal 26 for each N-channel TFT zone has cross-sectional area less than that of the corresponding photoresist 23 for that N-channel TFT zone formed in the previous step shown in FIG. 2(c). Then, for N-channel TFT zones, lightly doped drain (LDD) regions 241 are formed by implanting $P^+$ ions with the gate metal 26 as a mask. The N-channel TFT zones are covered with a photoresist 27, and then another ion implantation procedure is performed on the resulting structure with the photoresist 27 serving as a mask to form a P-channel TFT zone, as shown in FIG. 2(e). The dopants are $B_2Hx^+$ ions, and source/drain regions 242 are formed. Afterwards, an inter-layer dielectric layer 28 and source/drain conductive lines 29 are formed in sequence, as shown in FIG. 2(f), to obtain the desired LTPS-TFT structure.

With the increasing development of integrated circuits, electronic devices have a tendency toward miniaturization. As a result of miniaturization, the channel between the source and drain regions in each TFT will become narrower and narrower. A so-called "hot electron effect" is rendered, which impairs stability of the LTPS-TFT and results in current leakage. The LDD regions are useful to reduce the hot electron effect. Conventionally, a process involving many masks and steps are involved in order to form the LDD regions. Another conventional process of forming LDD regions by a self-aligned procedure would involve reduced masking steps. For the self-aligned procedure, the LDD regions do not overlap with the gate metal 26 thereabove. It is found, however, improved device stability will be obtained when the gate metal 26 extends over the LDD region 241 to a certain extent. Unfortunately, there is likely to be parasitic capacitance occurring in the overlapped region between the gate metal 26 and the LDD region 241, which adversely causes a voltage drift of the storage capacitor and liquid crystal capacitor in a pixel cell when the pixel is turned off.

SUMMARY OF THE INVENTION

It is an object of the present invention to provide process for producing a TFTLCD having an LDD region with satisfying stability and minimized voltage drift.

According to an aspect of the present invention relates to a process for producing a thin film transistor display. The process includes steps of providing a substrate; forming a polysilicon layer on the substrate; patterning the polysilicon layer to define a first and a second TFT regions; providing a first and a second doping masks on the polysilicon layer in the first and the second TFT regions to result in a first exposed portion in the first TFT region and a second exposed portion in the second TFT region; implanting a first doping material into the first and the second exposed portions, thereby defining a first doped region and a first channel region adjacent to the first doped region in the first TFT region, and a second doped region and a second channel region adjacent to the second doped region in the second TFT region; removing the first doping mask; providing a third doping mask on the first channel region, which partially overlies the first doped region, so as to result in a third exposed portion in the first TFT region smaller than the first exposed portion; implanting a second doping material into the third exposed portions to form first source/drain regions and simultaneously define a first LDD region; removing the second and the third doping masks; forming an insulator layer and a gate metal layer on the resulting structure; and patterning the gate metal layer to form a first and a second gate structures over the first and the second channel regions, respectively. The first gate structure is longer than the first channel, and the second gate structure has length smaller than or substantially equal to the second channel region.

In one embodiment, the process further comprises a step of implanting a third doping material into the second TFT region with the second gate structure serving as a doping mask to form second source/drain regions and a second LDD region.

In one embodiment, the process further comprises a step of covering a portion of the patterned polysilicon layer with a fourth doping mask before doping the patterned polysilicon layer for further defining a third TFT region.

In one embodiment, the first TFT region is an N-channel TFT region of a driving circuit, the second TFT region is an N-channel TFT region of an active matrix, and the third TFT region is a P-channel TFT region.

Preferably, the fourth doping mask is removed along with the second and the third doping masks.

In one embodiment, the process further comprises steps of: forming a third gate structure over the third TFT region at the same time when the first and the second gate structures are formed; and implanting a third doping material into the third TFT region with the third gate region serving as a mask to form source/drain regions of the third TFT region.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 4(a) to 4(g) are schematic cross-sectional views illustrating a process for producing an LTPS-TFTLCD having LDD regions according to a preferred embodiment of the present invention; and FIGS. 5(a) to 5(f) are schematic cross-sectional views illustrating a process for producing a CMOS thin film transistor according to a preferred embodiment of the present invention.

DETAILED DESCRIPTION OF THE PREFERRED EMBODIMENT

As previously described, the fabricating cost of a low-temperature polysilicon thin film transistor liquid crystal display (LTPS-TFTLCD) is relatively low because the active matrix and the driving circuit are formed on the same glass substrate. In addition, the LTPS-TFTLCD has reduced hot electron effect due to the presence of an LDD region. When the LDD region and the gate metal of the LTPS-TFTLCD overlap with each other, i.e. the gate metal of the LTPS-TFTLCD, an improved device stability is obtained while accompanied by some adverse effects such as current leakage and parasitic capacitance. Therefore, voltage drift of the storage capacitor and liquid crystal capacitor in a pixel cell is caused. As is known, the thin film transistors in the active matrix and the driving circuit perform different functions and thus have different requirements. For example, the thin film transistor in the active matrix requires accurate voltage levels. On the contrary, good device stability is prerequisite for the thin film transistor in the driving circuit.

Figure 1A:
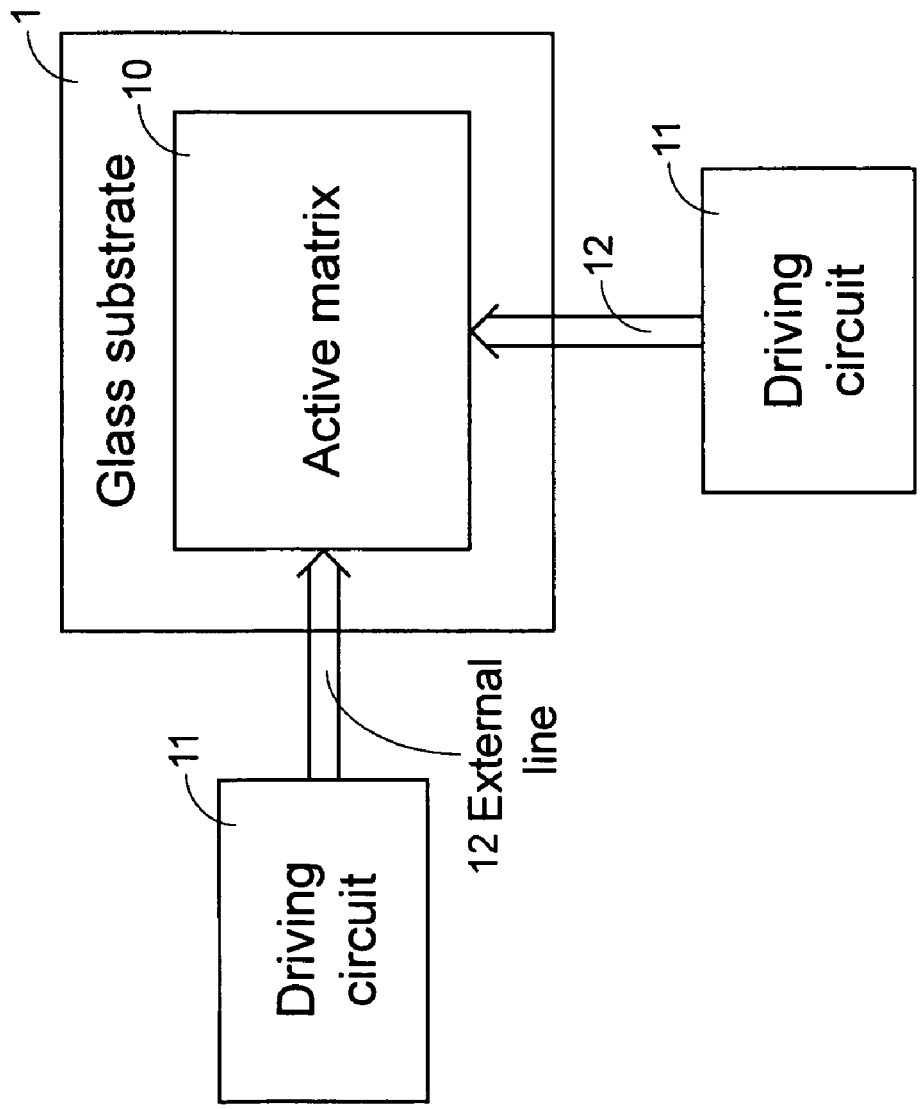
FIG. 1(a) is a block diagram schematically illustrating a conventional TFTLCD.
Figure 1B:
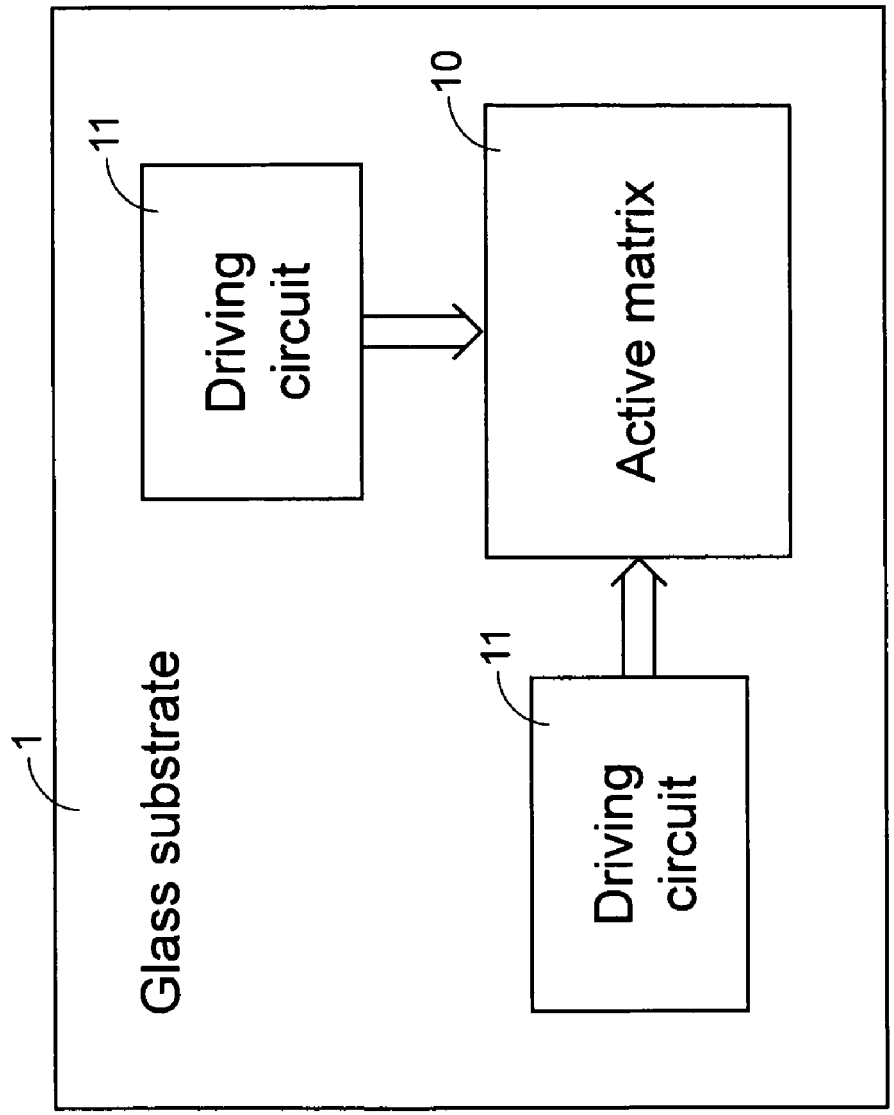
FIG. 1(b) is a block diagram schematically illustrating a conventional LTPS-TFTLCD.
Figure 2A:
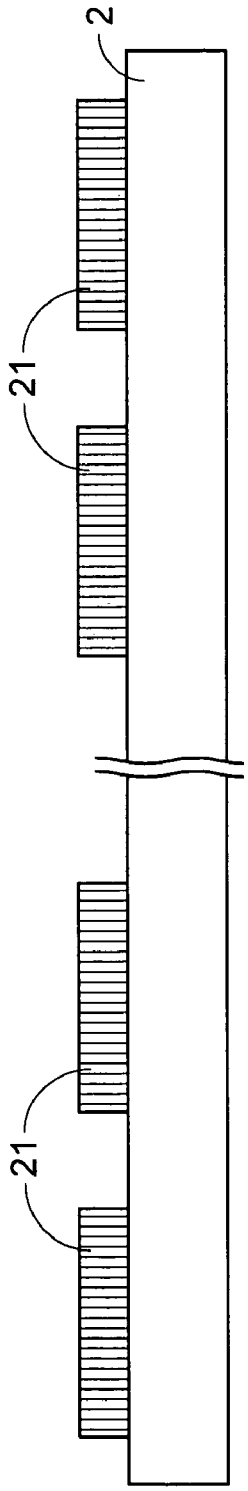
FIGS. 2(a) to 2(f) are schematic cross-sectional views illustrating a conventional process for producing an LTPS-TFTLCD having LDD regions.
Figure 2B:
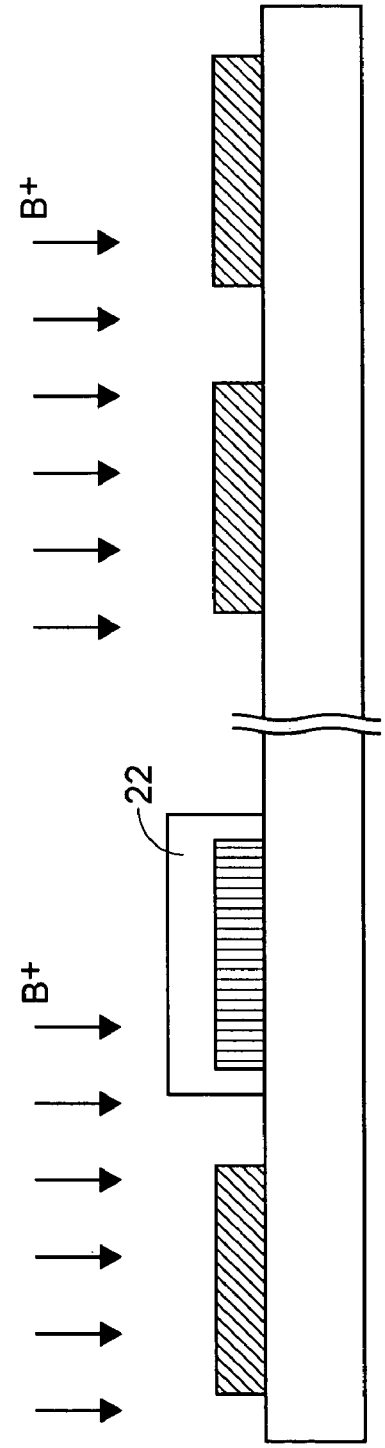
Figure 2C:
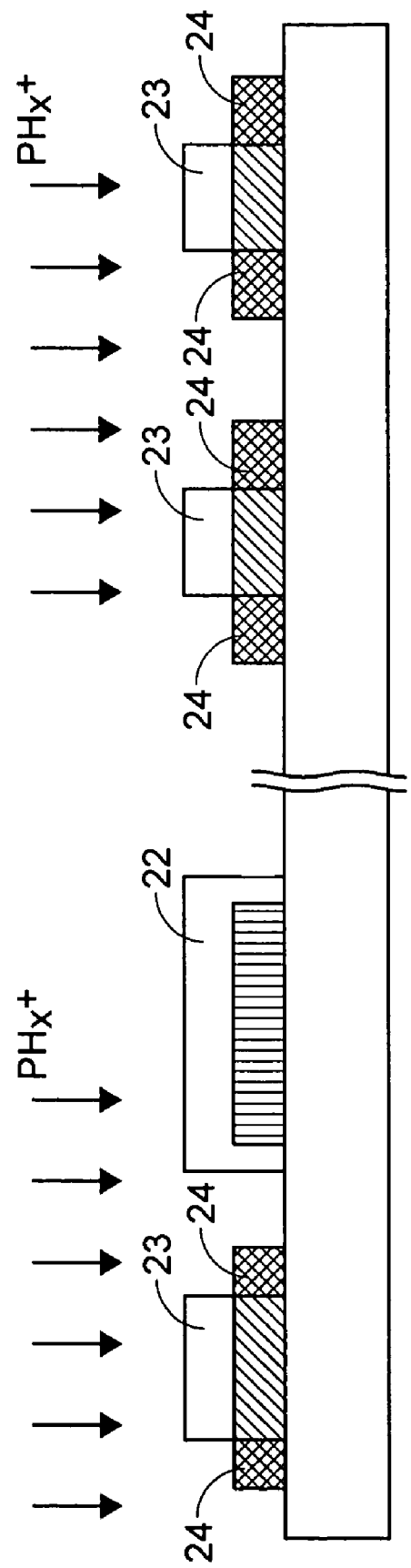
Figure 2D:
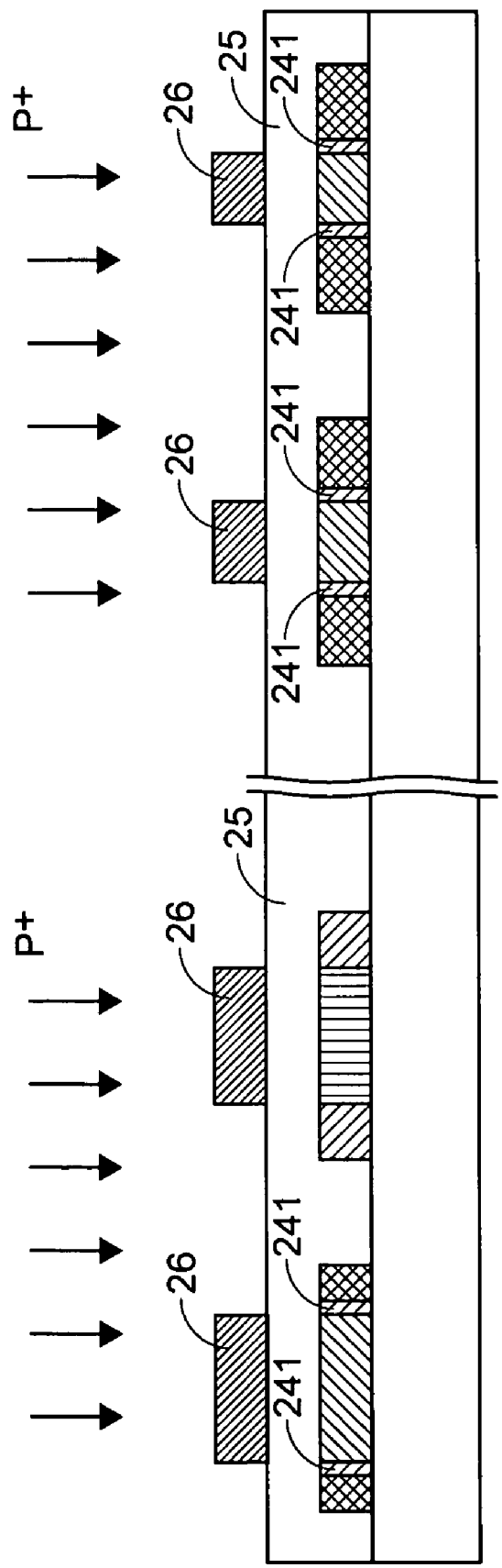
Figure 2E:
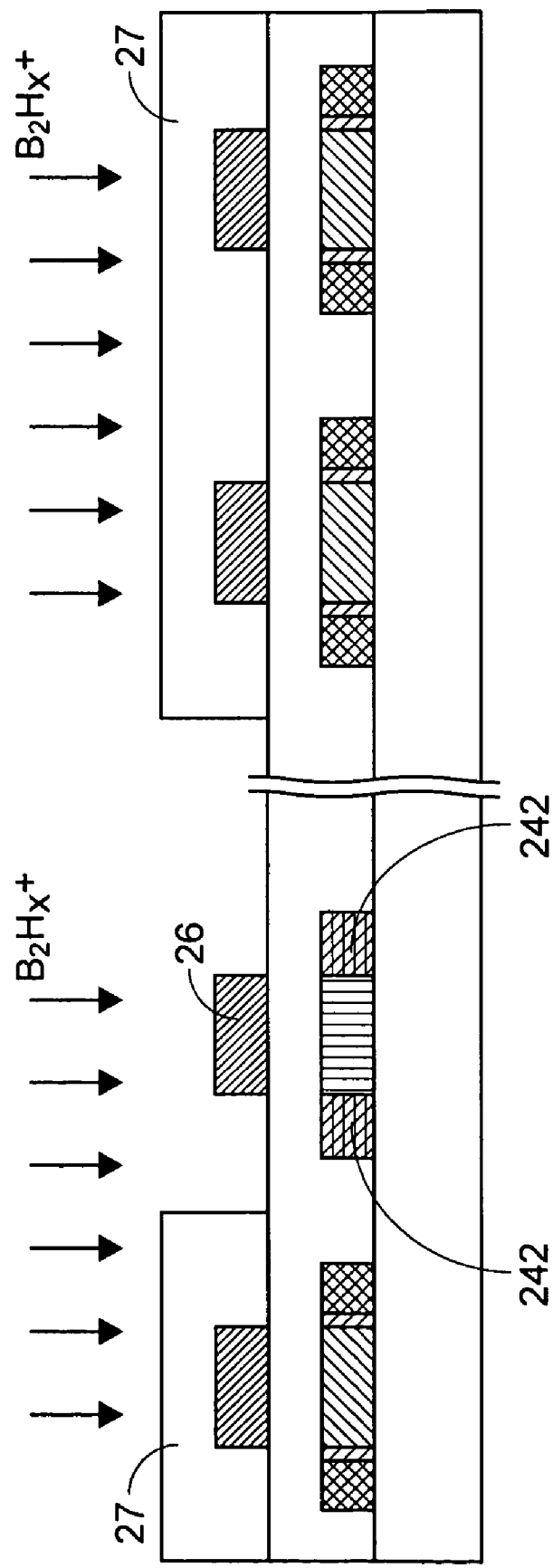
Figure 2F:
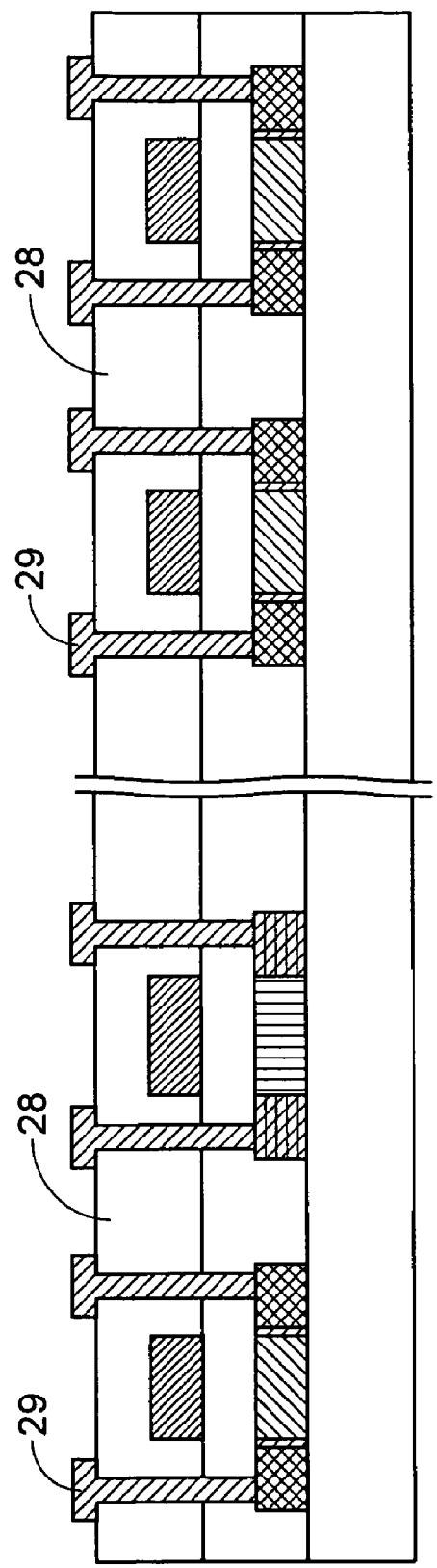
Figure 3:
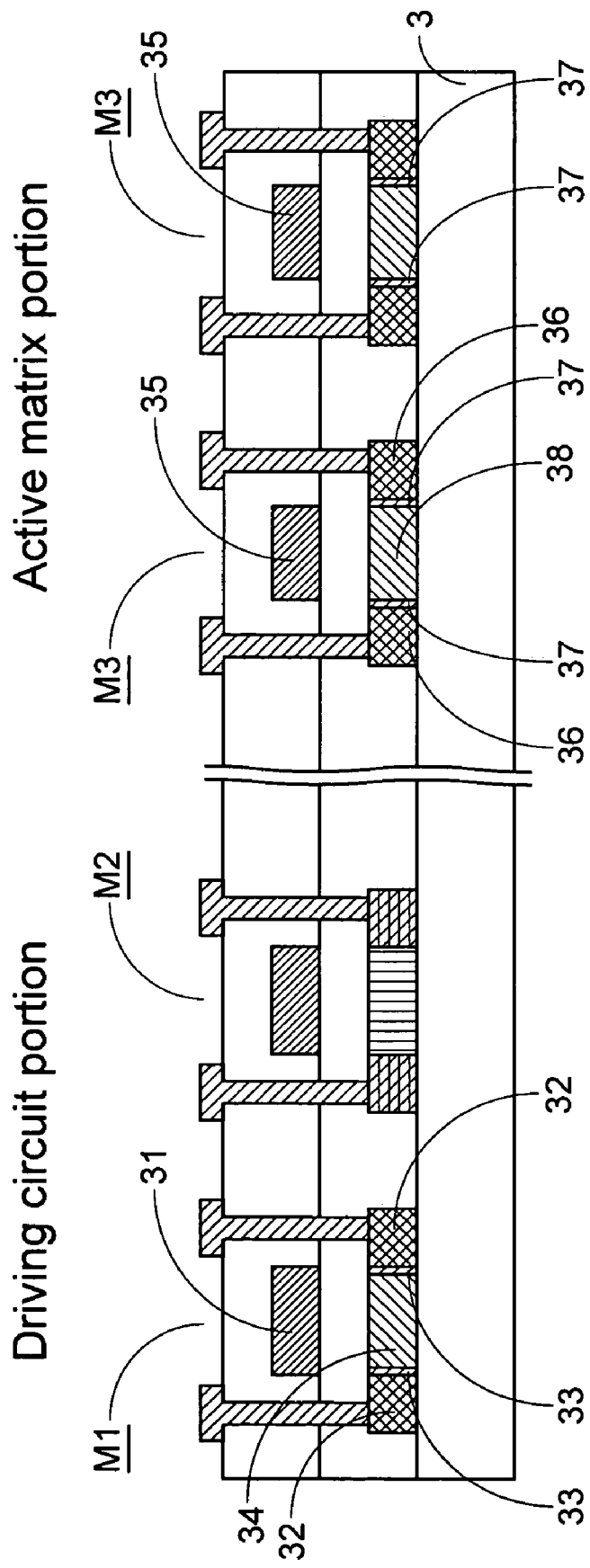
FIG. 3 is a schematic cross-sectional view illustrating the structure of an LTPS-TFTLCD according to a preferred embodiment of the present invention.

Based on the above concept, a specified LTPS-TFTLCD is developed according to the present invention, as can be seen in FIG. 3. The LTPS-TFTLCD comprises a driving circuit portion and an active matrix portion, which are formed on the same substrate 3. In the driving circuit portion, an N-channel TFT M1 and a P-channel TFT M2 are included. In the active matrix portion, N-channel TFTs M3 are included. The N-channel TFT M1 comprises a gate structure 31, source/drain regions 32, LDD regions 33 and a channel region 34. According to the present invention, the gate region 31 disposed over the channel region 34 overlaps with the LDD regions 33 in order to assure of good device stability. On the other hand, the thin film transistor structure M3, which comprises a gate structure 35, source/drain regions 36, LDD regions 37 and a channel region 38, has the gate structure 35 thereof substantially staggered with the LDD regions 37. In other words, the gate structure 35 does not overlap with the LDD regions 37 so as to reduce current leakage and parasitic capacitance.

A process for producing an LTPS-TFT similar to that of FIG. 3 according a preferred embodiment of the present invention is illustrated with reference to FIGS. 4(a) to 4(g).

Figure 4A:
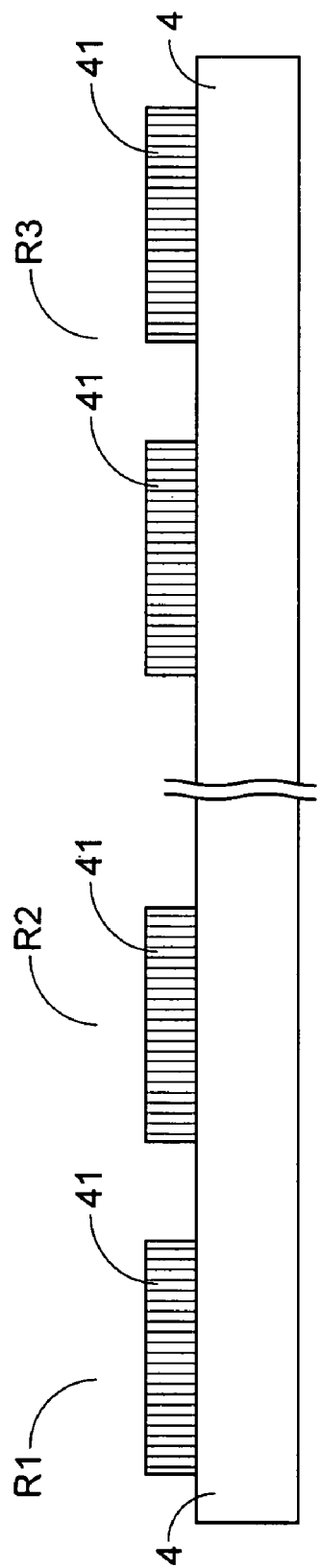
Figure 4B:
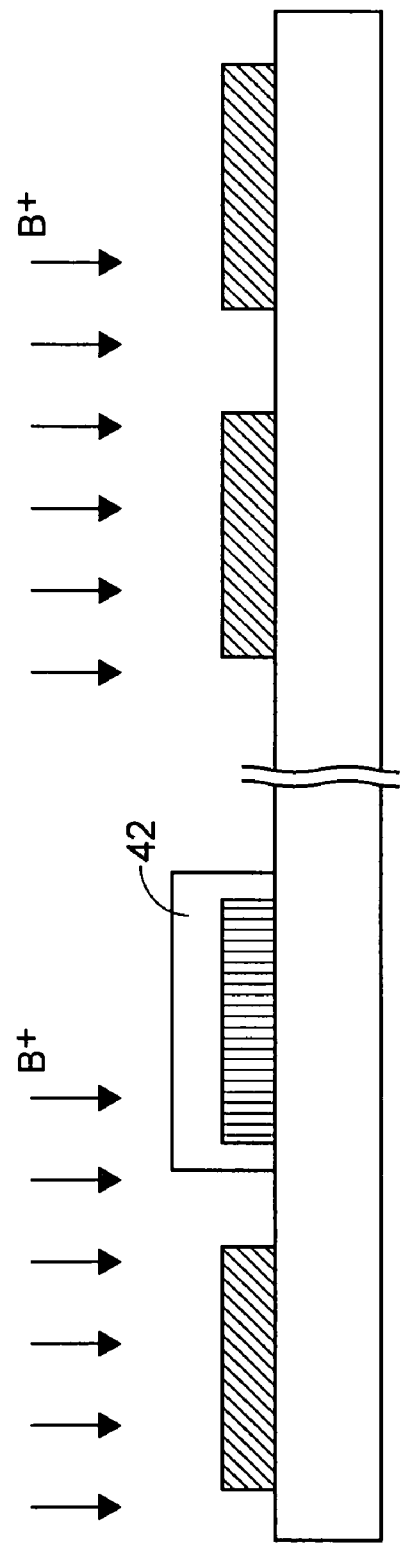
Figure 4C:
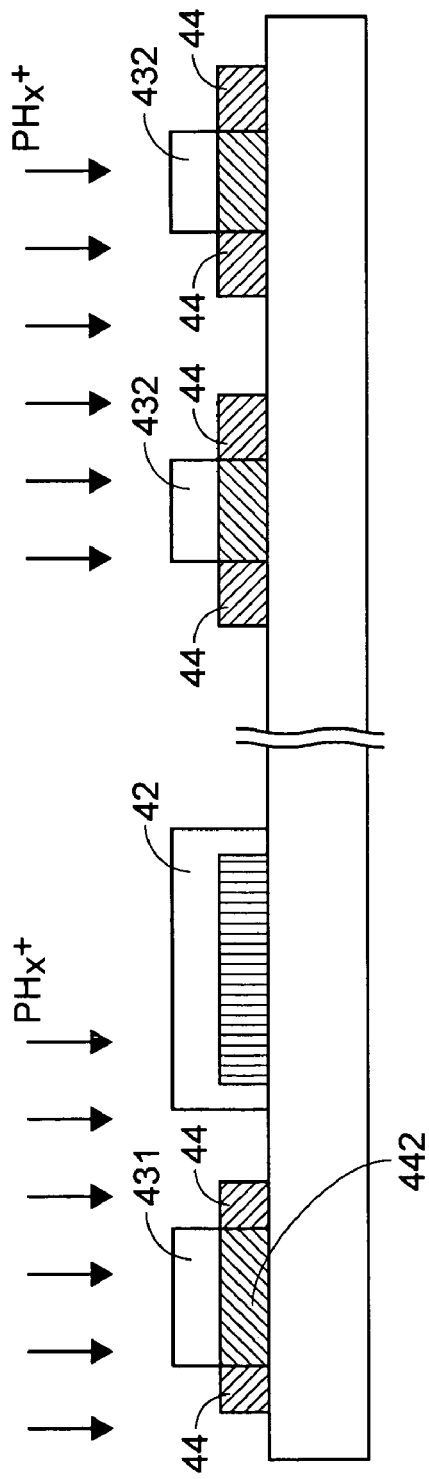
Figure 4D:
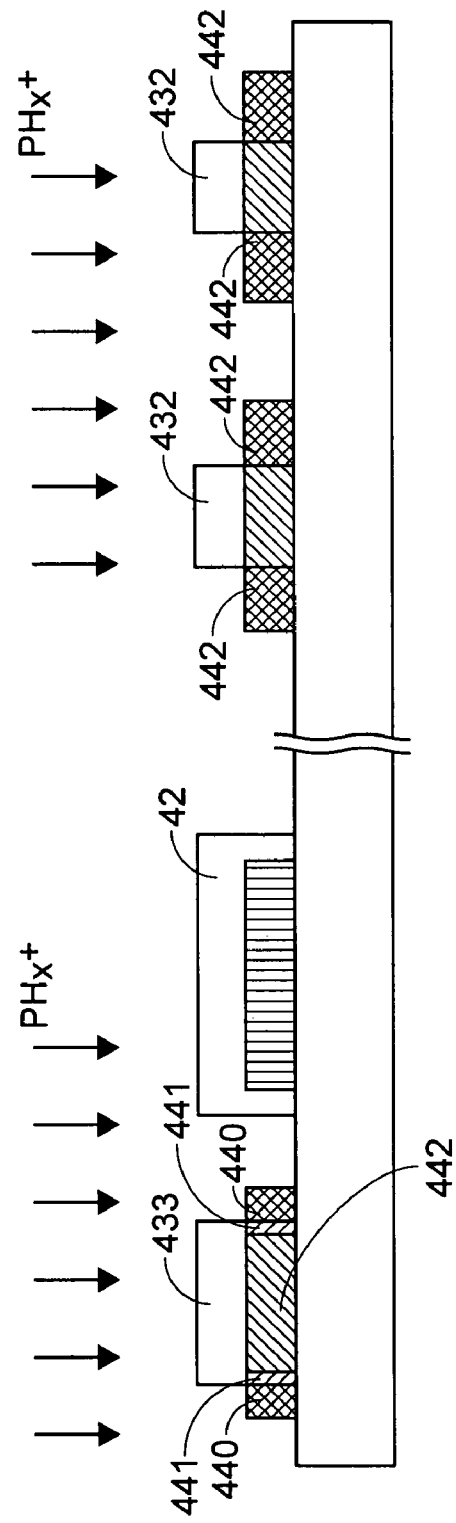
Figure 4G:
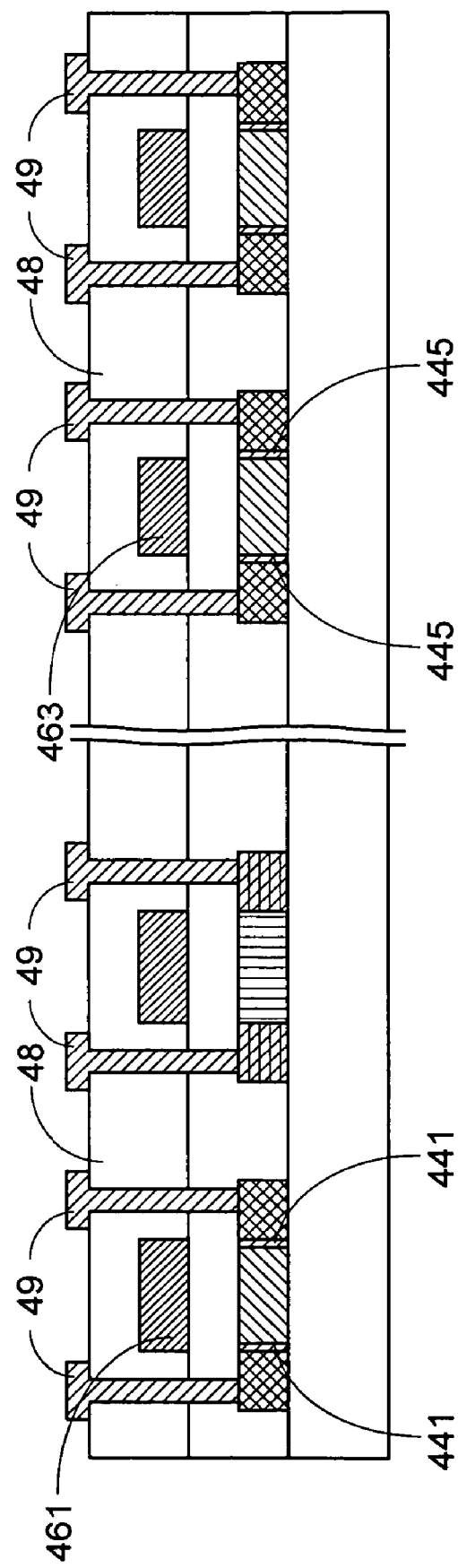

In FIG. 4(a), a polysilicon layer 41 is formed on a glass substrate 4 by laser annealing an amorphous silicon layer applied to the glass substrate 4 at low temperature, and patterning and etching the annealed silicon layer. Then, as shown in FIG. 4(b), a photoresist 42 is formed on a selected region R2 of the polysilicon layer 41, which is defined as a P-channel TFT zone, and an ion-implantation procedure is performed on the resulting polysilicon layer 41 with the photoresist 42 serving as a mask. By the ion-implantation procedure, $B^+$ ions are implanted to form N-channel TFT zones in regions R1 and R3. Then, photoresists 431 and 432 are formed on the N-channel TFT zones in the active matrix portion and the driving circuit portion, respectively, and $PHx^+$ ions are implanted into the exposed parts of the N-channel TFT zones with the photoresist 431 and 432 serving as masks, thereby defining source/drain regions 44, as can be seen in FIG. 4(c). Meanwhile, the channel region 442 of the N-channel TFT zone in the region R1, is defined. Afterwards, the photoresist 431 is removed and replaced by a photoresist 433 having greater as-shown cross-sectional length than the photoresist 431. As shown in FIG. 4(d), $PHx^+$ ions are continuously implanted into the N-channel TFT zones in the regions R1 and R3 with the photoresist 433 and 432 serving as masks, thereby forming heavily doped source/drain regions 440 and 442 for all the N-channel TFT zones in the regions R1 and R3 and LDD regions 441 for the N-channel TFT zone in the region R1. After the photoresists 42, 432 and 433 are removed, a gate insulator layer 45 is formed on the resulting structure. Then, a gate metal layer (for example made of molybdenum) is formed on the gate insulator 45, and the gate metal layer is patterned to form gate structures 461, 462 and 463. As shown in FIG. 4(e), the gate structure 461 has cross-sectional length substantially the same as that of the photoresist 433 having been removed previously, and thus the gate structure 461 has length greater than the channel region 442. On the other hand, the gate structure 463 has cross-sectional length less than that of the corresponding photoresist 432 having been removed in the previous step shown in FIG. 4(d). Then, $PHx^+$ ions are continuously implanted with the gate metal structures 461, 462 and 463 serving as masks in the regions R1, R2 and R3, respectively, thereby defining source/drain regions 444 in the region R2, and forming LDD regions 445 for the N-channel TFT zones in the region R3 of active matrix portion, as can be seen in FIG. 4(e). Meanwhile, the channel region 446 of the N-channel TFT zone in the region R3 is defined. In this embodiment, the gate structure 463 has length substantially identical to that of the channel region 446. Depending on various processes, however, the present structure still works if the gate structure 463 is shorter than the channel region 446. The N-channel TFT zones in the regions R1 and R3 are then covered with a photoresist 47, and then another ion implantation procedure is performed on the resulting structure with the photoresist 47 serving as a mask so as to form a P-channel TFT zone in the region R2, as shown in FIG. 4(f). The dopants are $B_2Hx^+$ ions, and source/drain regions 446 are formed. Afterwards, an interlayer dielectric layer 48 and source/drain conductive lines 49 are formed, as shown in FIG. 4(g), according to any proper technique, so as to obtain the desired LTPS-TFT structure. That is, the gate electrode 461 of the N-channel TFT in the driving circuit portion overlies the LDD regions 441 to exhibit good device stability, and the effect of the possible parasitic capacitance on a driving circuit is insignificant. On the other hand, the gate electrode 463 and the LDD regions 445 of the N-channel TFT in the active matrix portion stagger from each other to prevent from the voltage level drift resulting from current leakage and parasitic capacitance.

The concept of the present invention can also be applied to produce a complimentary metal oxide semiconductor (CMOS) thin film transistor. The process will be illustrated with reference to FIGS. 5(a) to 5(f).

Figure 5C:
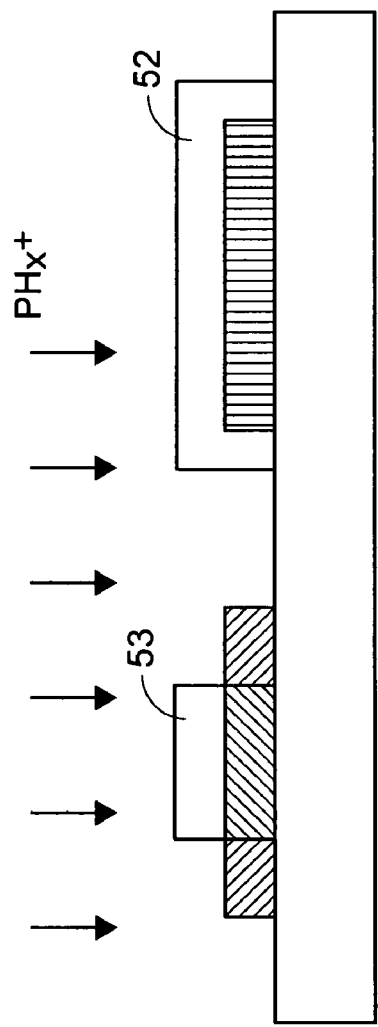
Figure 5D:
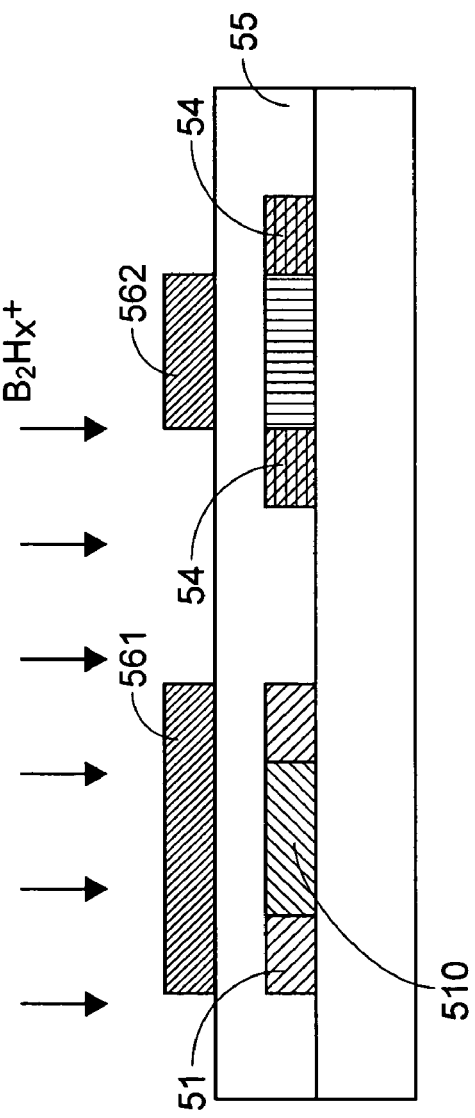

In FIG. 5(a), a polysilicon layer 51 is formed on a glass substrate 5 by laser annealing an amorphous silicon layer applied to the glass substrate 4 at low temperature, and patterning and etching the annealed silicon layer, thereby defining a first and a second TFT regions R1 and R2 to serve as an N-channel TFT zone and a P-channel TFT zone, respectively. Then, as shown in FIG. 5(b), a photoresist 52 is formed on the polysilicon layer 51 in the N-channel TFT zone R1, and an ion-implantation procedure is performed on the resulting polysilicon layer 51 with the photoresist 52 serving as a mask. By the ion-implantation procedure, $B^+$ ions are implanted into the polysilicon layer 51 in the N-channel TFT zone R1. Then, as shown in FIG. 5(c), a photoresist 53 is partially formed on the polysilicon layer 51 in the N-channel TFT zone R1, and $PHx^+$ ions are implanted into the polysilicon layer 51 in the N-channel TFT zone R1 with the photoresist 53 serving as a mask. After the photoresists 52 and 53 are removed, a gate insulator 55 is formed on the resulting structure. Then, a gate metal layer (for example made of molybdenum) is formed on the gate insulator 55, and the gate metal layer is patterned to form gate structures 561 and 562, as shown in FIG. 5(d). The gate structure 561 has cross-sectional length substantially the same as that of the polysilicon layer 51 in the N-channel TFT zone R1. Another ion implantation procedure is performed on the resulting structure with the gate structure 562 serving as a mask in the P-channel TFT zone R2. The dopants are $B_2Hx^+$ ions, and source/drain regions 54 are formed. Then, the gate structure 561 is removed and replaced by another gate region 563 having cross-sectional length smaller than the gate structure 561 but greater than the channel region 510 of the polysilicon layer 51. Preferably but not necessarily, the length of the gate structure 563 is equal to the total length of the channel region 510 plus the LDD regions 591, as shown in FIG. 5(e). Then, a photoresist 57 is formed on the gate region 563, and the P-channel TFT zone is covered with a photoresist 58. Then, $PHx^+$ ions are implanted into the N-channel TFT zone with the photoresist 57 serving as a mask, thereby forming source/drain regions 59 and LDD regions 591 in the N-channel TFT zone R1. Afterwards, an interlayer dielectric layer 60 and source/drain conductive lines 61 are formed, as shown in FIG. 5(f), to obtain the desired CMOS structure.

From the above description, it is known that the process for fabricating the TFTLCD having an LDD region is performed without increasing masking steps when compared with the conventional self-aligned procedure. Advantageously, the TFTLCD fabricated according to the present invention has an LDD region and a gate metal overlapped with each other so as to achieve good device stability.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for producing a thin film transistor display comprising steps of:
   providing a substrate;
   forming a polysilicon layer on said substrate;
   patterning said polysilicon layer to define a first and a second TFT regions;
   providing a first and a second doping masks on said polysilicon layer in said first and said second TFT regions to result in a first exposed portion in said first TFT region and a second exposed portion in said second TFT region;
   implanting a first doping material into said first and said second exposed portions, thereby defining a first doped region and a first channel region adjacent to said first doped region in said first TFT region, and a second doped region and a second channel region adjacent to said second doped region in said second TFT region;
   removing said first doping mask without removing said second doping mask;
   providing a third doping mask on said first channel region, which partially overlies said first doped region, so as to result in a third exposed portion in said first TFT region smaller than said first exposed portion;
   implanting a second doping material into said third exposed portions and said second exposed portion to form first source/drain regions and second source/drain regions and simultaneously define a first LDD region;
   removing said second doping mask along with said third doping mask;
   forming an insulator layer and a gate metal layer on the resulting structure; and
   patterning said gate metal layer to form a first and a second gate structures over said first and said second channel regions, respectively,
   wherein in a certain direction, said first gate structure is longer than said first channel, and said second gate structure has length no greater than the length of said second channel region.

2. The process according to claim 1 wherein the length of said second gate structure is substantially identical to the length of said second channel region in said certain direction.

3. The process according to claim 1 wherein said first, said second and said third doping masks are photoresists.

4. The process according to claim 1 further comprising a step of doping said patterned polysilicon layer in order to define said first and second TFT regions.

5. The process according to claim 1 further comprising a step of implanting a third doping material into said second TFT region with said second gate structure serving as a doping mask to form a second LDD region.

6. The process according to claim 1 further comprising a step of covering a portion of said patterned polysilicon layer with a fourth doping mask before doping said patterned polysilicon layer for further defining a third TFT region.

7. The process according to claim 6 wherein said first TFT region is an N-channel TFT region of a driving circuit, said second TFT region is an N-channel TFT region of an active matrix, and said third TFT region is a P-channel TFT region.

8. The process according to claim 7 wherein said fourth doping mask is removed along with said second and said third doping masks.

9. The process according to claim 8 further comprising steps of:
   forming a third gate structure over said third TFT region at the same time when said first and said second gate structures are formed; and
   implanting a third doping material into said third TFT region with said third gate region serving as a mask to form source/drain regions of said third TFT region.

* * * * *